United States Patent [19]
Chen et al.

[11] Patent Number: 5,939,955
[45] Date of Patent: *Aug. 17, 1999

[54] ASSEMBLY OF INDUCTORS WOUND ON BOBBIN OF ENCAPSULATED ELECTRICAL COMPONENTS

[75] Inventors: John Chen, Danville, Calif.; Wong Chiu Kan, Hong Kong, China

[73] Assignee: Bel Fuse, Inc., Jersey City, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/872,664

[22] Filed: Jun. 10, 1997

[51] Int. Cl.⁶ .............................. H03H 7/00; H01F 27/30
[52] U.S. Cl. .......................... 333/185; 333/167; 336/192; 336/208
[58] Field of Search ..................................... 333/138, 140, 333/167, 177, 183–185, 181; 336/192, 205, 208; 361/306.1, 303, 308.1, 308.2, 308.3, 763, 301.3

[56] References Cited

U.S. PATENT DOCUMENTS

| | | | |
|---|---|---|---|
| 3,602,846 | 8/1971 | Hauser | 333/140 |
| 4,275,368 | 6/1981 | Wimmer | 333/185 X |
| 4,453,144 | 6/1984 | Tamura et al. | 333/185 X |
| 4,680,560 | 7/1987 | Yorita et al. | 333/184 X |
| 4,715,118 | 12/1987 | Bernard et al. | 361/308.1 X |
| 5,446,427 | 8/1995 | Nakayama et al. | 333/185 X |

FOREIGN PATENT DOCUMENTS

| | | | |
|---|---|---|---|
| 61-278310 | 12/1986 | Japan | 333/185 |
| 62-18104 | 1/1987 | Japan | 333/140 |
| 64-27305 | 1/1989 | Japan | 333/185 |
| 4-208510 | 7/1992 | Japan | 361/306.1 |
| 93/08640 | 4/1993 | WIPO | 333/185 |

*Primary Examiner*—Seungsook Ham
*Attorney, Agent, or Firm*—Ostrolenk, Faber, Gerb & Soffen, LLP

[57] ABSTRACT

An electrical component assembly which includes a plurality of spaced capacitors, a pair of respective leads extending from each capacitor and a common encapsulant encapsulating the capacitors such that portions of each of the leads extend from the encapsulant and such that bobbins are formed between adjacent capacitors. Respective coils are then formed about each bobbin and connected to the capacitors.

9 Claims, 5 Drawing Sheets

ASSEMBLY OF INDUCTORS WOUND ON BOBBIN OF ENCAPSULATED ELECTRICAL COMPONENTS

BACKGROUND OF THE INVENTION

This invention relates to electrical component inductor assemblies and, in particular, to assemblies of inductors and other electrical components, such as capacitors, and to methods of making the same.

Conventional inductor/capacitor assemblies, such as Butterworth filters include a bobbin having a plurality of coils wound thereon which are connected to a bank of separately mounted capacitors. Typically, two bobbins, provided with wound coils, are mounted on opposite sides of a bank of capacitors. The coils of each bobbin are connected to capacitor electrodes on the same side as the coil.

More specifically, referring to FIG. 1, there is illustrated an electrical schematic of a conventional Butterworth filter 10 which includes a bank of capacitors, $C_1$–$C_4$, interconnected with a plurality of coils $L_1$–$L_6$. Physically, referring to FIG. 2, the coils $L_1$–$L_6$ are wound on first and second bobbins 11, 12 which are arranged on opposite sides of the bank of capacitors $C_1$–$C_4$. More specifically, the coils $L_1$, $L_2$ and $L_3$ are wound between respective flanges of the bobbin 11 and the coils $L_4$, $L_5$ and $L_6$ are wound between respective flanges of the bobbin 12. The respective ends of the coils $L_1$, $L_2$ and $L_3$ are connected to respective first electrodes 13 of the capacitors $C_1$–$C_4$ on the side facing the coils $L_1$, $L_2$ and $L_3$ and the respective ends of the coils $L_4$, $L_5$ and $L_6$ are connected to respective second electrodes 14 of the capacitors facing the coils $L_4$, $L_5$ and $L_6$.

One of the problems associated with the prior art filter is the necessity of using two bobbins.

Further, prior art bobbins employ flanges to provide predetermined spacing between the inductors so as to facilitate the winding process and to maintain the winding pitch between each inductor. Flanged bobbins, however, are more costly and space consuming than unflanged bobbins.

Additionally, in conventional assembly of the prior art filter, the coils are not connected to the capacitors until after the capacitors are mounted to a printed circuit board. As a result, testing of the filter cannot be done until after the capacitors and coils have been assembled on the printed wiring board and interconnected. Accordingly, testing of the filter is more complicated than if the filter could be tested prior to assembly on the board. Further, any defects in the filter require costly and time consuming repair procedures.

To address these problems an improved assembly and method of making has been proposed in related application Ser. No. 08/688,564, filed Jul. 28, 1996, and entitled "INDUCTOR ASSEMBLY AND METHOD OF MAKING SAME", the entire disclosure of which is incorporated herein by reference (hereinafter "the '564 application"). In accordance with the '564 application, an inductor assembly includes a plurality of electrical components, such as capacitors, attached to a flangeless bobbin at spaced locations. Respective coils are wound about the bobbin between adjacent ones of the plurality of electrical components, the spacing between adjacent electrical components determining the pitch of the coils wound therebetween.

The '564 application overcomes the problem of conventional assemblies by providing an inductor/capacitor assembly which utilizes a single bobbin and which can be separately tested.

SUMMARY OF THE INVENTION

The object of the present invention is to provide an electrical component assembly which, like the assembly of the '564 application, utilizes a single bobbin and which can be separately tested, but which is less expensive to manufacture and is more compact.

In accordance with the present invention, the foregoing and other objects are accomplished by an electrical component assembly which includes a plurality of spaced electrical components, a pair of respective leads extending from each electrical component and a common encapsulant encapsulating the electrical components such that portions of each of the leads extend from the encapsulant.

In accordance with one aspect of the invention the electrical components are capacitors. In accordance with another aspect of the invention, bobbins are formed between adjacent capacitors and respective coils are wound about the bobbins, each coil having respective ends connected to a lead of one of the capacitors.

In accordance with a further aspect of the invention, a method is provided for manufacturing an electrical component assembly, which method includes the steps of providing a lead frame comprising a pair of spaced longitudinally extending support members having a plurality of spaced lead elements extending transversely from each support element. The respective lead elements from one support member extend towards and are in alignment with respective lead elements extending from the other support elements so as to form pairs of aligned lead elements. Respective electric components are then attached to pairs of the aligned lead elements. Thereafter, the electric components and the elements are encapsulated such that the electrical components are fully encapsulated and that portions of the lead elements extend from the encapsulated body. The support members are then severed from the lead elements.

In accordance with one aspect of the method, the electrical components are capacitors. In accordance with another aspect of the invention, the encapsulation is such that bobbins are formed between adjacent capacitors. Coils are wound about the bobbins and connected to respective capacitors.

Other aspects and advantages of the invention will become apparent from the following more detailed description, taken in conjunction with the accompanying drawings.

DETAILED DESCRIPTION OF THE PREFERRED EMBODIMENT(S)

Figure 3:
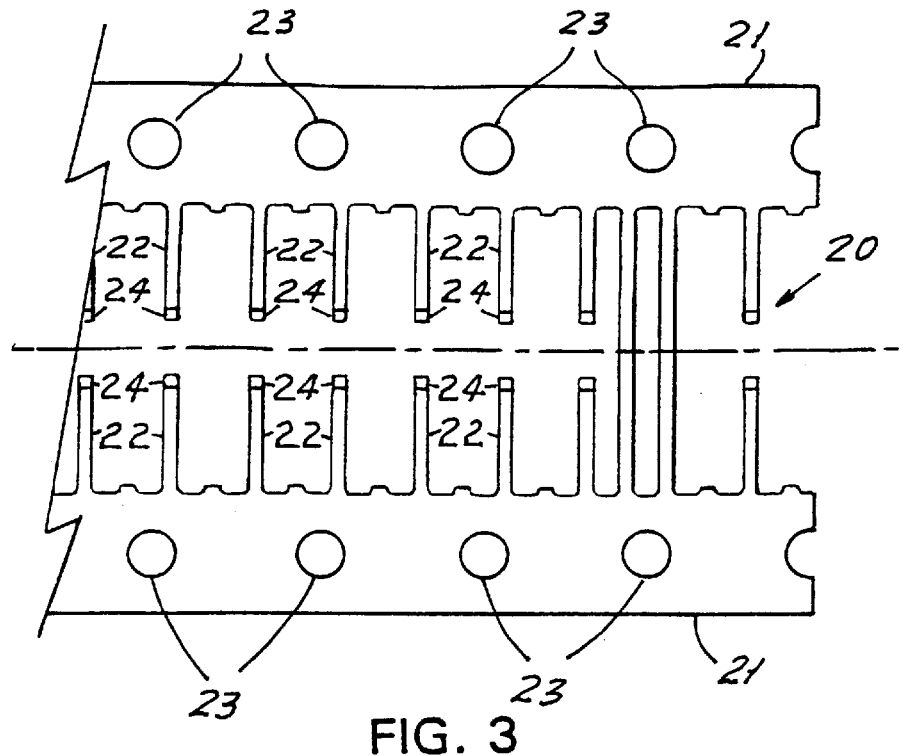
FIG. 3 is a plan view of a lead frame employed in the manufacture of a molded electrical component assembly in accordance with the present invention.

Referring now to the drawings and, in particular to FIG. 3, there is shown a lead frame 20 used in the manufacture of an electrical assembly in accordance with the present invention. The lead frame 20 includes a pair of spaced, parallel support elements or rails 21 having a plurality of lead elements 22 extending from each rail 21 towards the other rail 21. Respective ones of the lead elements 22 extending from one rail 21 are aligned with respective ones of the lead elements 22 extending from the other rail 21 to form pairs of aligned leads.

The lead frame 20 is typically 0.008 to 0.10 inches in thickness and is formed of phosphor bronze or bronze alloy by a conventional stamping machine. Each rail 21 includes a plurality of index holes 23 to facilitate forming and assembly operations.

Figure 4:
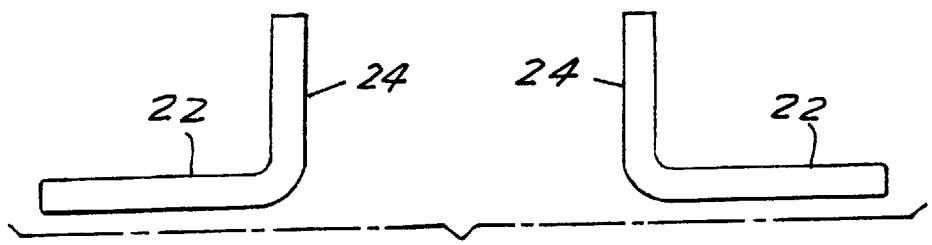
FIG. 4 is an elevational view of the lead frame of FIG. 3 after the upward bending of the ends of the leads thereof.
Figure 5:
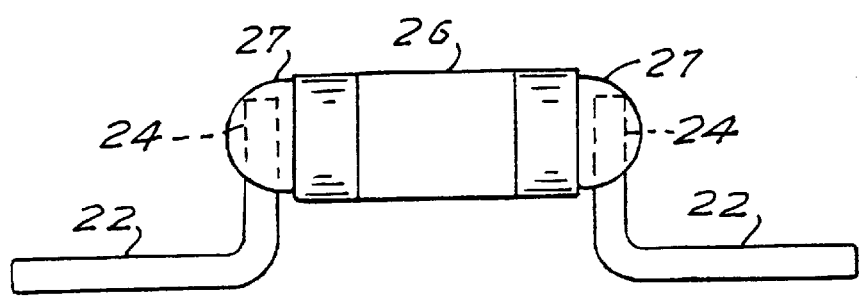
FIG. 5 is an elevation view showing a capacitor inserted between and soldered to the upwardly bent opposing leads of the lead frame of FIG. 2.

As best seen in FIG. 4, the ends 24 of each of the lead elements 22 are bent upwardly approximately 90°. Thereafter, as seen in FIG. 5, electrical components, such as flat capacitors 26, are inserted between opposing ends 24 and the capacitors 26 fixed to the ends 24 by solder 27, for example. Advantageously, the soldering is effected using a conventional mass soldering technique, such as dip or flow soldering.

Figure 6:
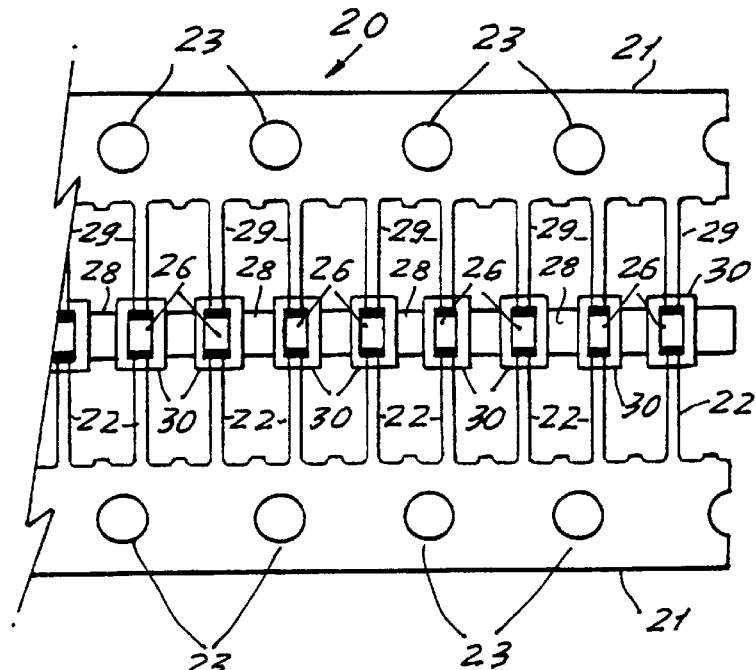
FIG. 6 is a plan view of the assembly of Fig. after molding.

After soldering, the assembly of the lead frame 20 with the attached capacitors 26 is placed in a conventional molding press (not shown), which has dies shaped such that after molding, as seen in FIGS. 6, each of the capacitors 26 is fully encapsulated with bobbins 28 formed between adjacent capacitors and with portions 29 of the lead elements 22 left unmolded, the encapsulated capacitors being designated by the reference numeral 31. The encapsulating material is typically a magnetic material, such as a combination of powder, iron and plastic.

Figure 7:
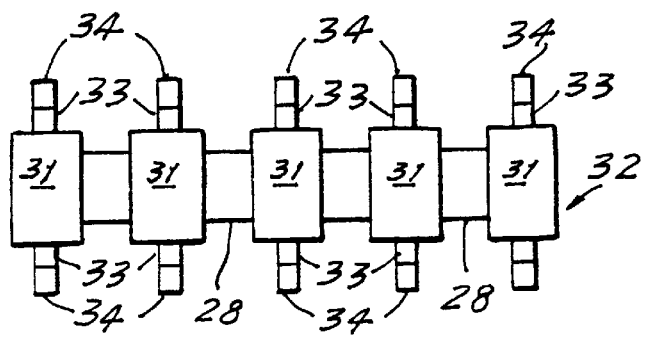
FIGS. 7 and 8 are plan and elevated views of the assembly of FIG. 5 after severing of the side rails of the lead frame thereof.
Figure 8:
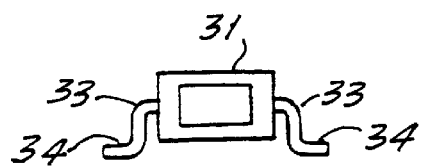

Referring to FIGS. 7 and 8, after removal from the molding press, the rails 21 are severed, leaving a molded assembly 32 comprising the encapsulated capacitors 31 separated by respective bobbins 28, with each encapsulated capacitor 31 having extended leads 33. Advantageously, the ends 34 of the leads 33 are bent in an S-shape so that the ends 34 extend below the bottom surface of the encapsulated capacitors 31 to enable mounting of the assembly 32 to another component, such as a printed circuit board (not shown).

Figure 9:
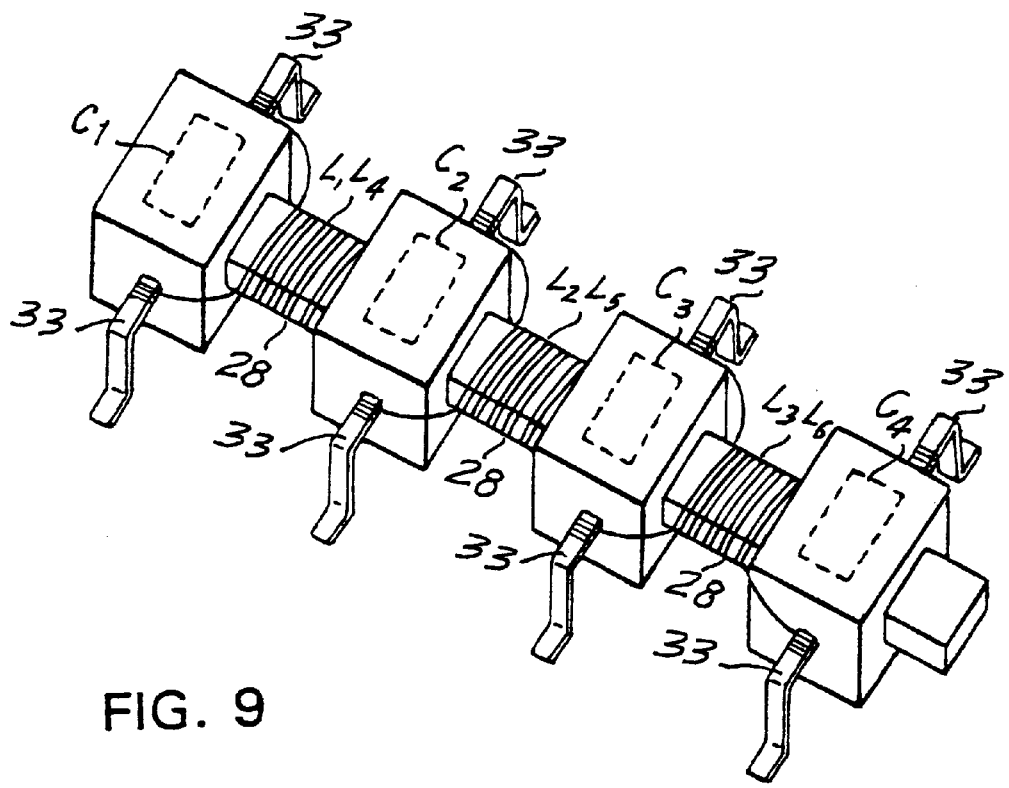
FIG. 9 is a perspective view showing first and second groups of coils wound on the assembly of FIGS. 7 and 8 and connected to respective capacitors thereof to form a filter.

To form a capacitor-inductor assembly, coils are wound on each bobbin 28 and are connected to respective leads 33. More specifically, referring to FIG. 9, to form a filter 40, such as the Butterworth filter shown in FIG. 1, first and second groups of coils $L_1$, $L_2$ and $L_3$ and $L_4$, $L_5$ and $L_6$, respectively, are wound about the assembly on the bobbins between respective ones of the encapsulated capacitors, designated capacitors $C_1$–$C_4$ in FIGS. 9–11, with the second group of coils $L_4$, $L_5$ and $L_6$ being wound over the first group $L_1$, $L_2$ and $L_3$. Although the coils $L_1$–$L_6$ may be wound as discreet entities, with the respective ends of the coils then connected to respective leads of the capacitors, preferably the coils $L_1$–$L_6$ are wound continuously.

Figure 10:
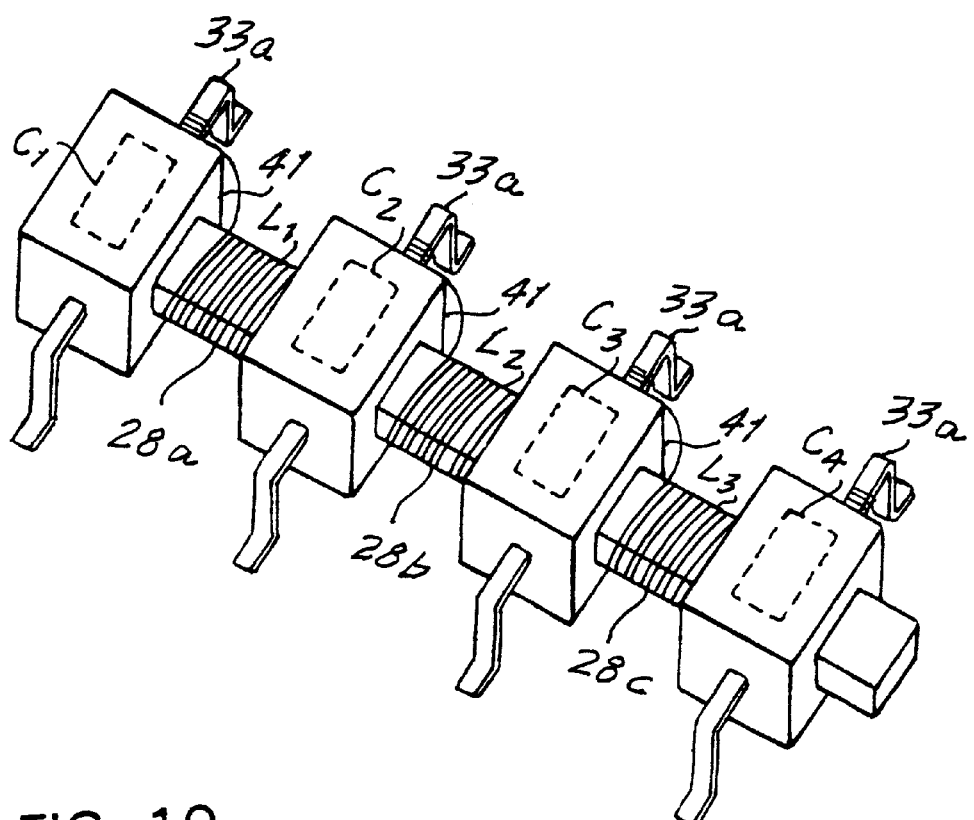
FIG. 10 is a perspective view showing the filter of FIG. 9 prior to winding the second group of coils.

Referring to FIG. 10, in accordance with a preferred embodiment of the method, the coils $L_1$–$L_3$ of the first group are formed by first winding one end of a wire 41 around a first lead 33a of the first capacitor $C_1$. The wire 41 is then wound about the bobbin 28a between the capacitors $C_1$ and $C_2$ to form the coil $L_1$. The wire 41 is then wound about a first lead 33a of the capacitor $C_2$ and then about the bobbin 28b between the capacitors $C_2$ and $C_3$ to form the coil $L_2$. Then, the wire 41 is wound about a first lead 33a of the capacitor $C_3$ and about the bobbin 28c between the capacitors $C_3$ and $C_4$ to form the coil $L_3$. The wire 41 is then wound about a first lead 33a of the capacitor $C_4$.

Figure 11:
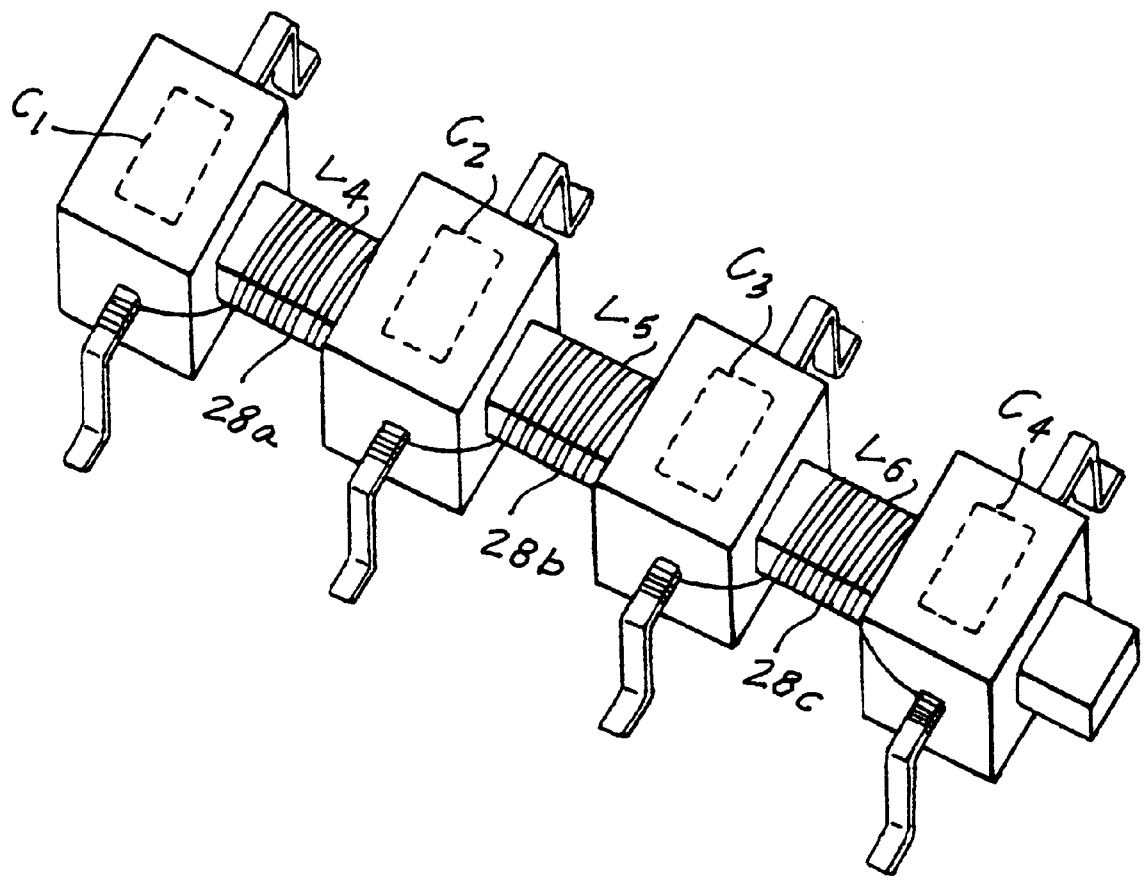
FIG. 11 is a perspective view showing the filter of FIG. 10 after the second group of coils has been wound with the first group of coils not shown for the sake of clarity.

Referring to FIG. 11, the coils $L_4$, $L_5$ and $L_6$ of the second group are formed by winding a wire about the respective bobbins 28a–28c continuously with the portions between the coils $L_4$, $L_5$ and $L_6$ being wound about respective capacitor second leads 33b.

The second group of coils $L_4$, $L_5$ and $L_6$ are wound by winding backward from the end of the first winding to the start of the winding without changing the turning or winding direction. This results in a desirable reversal of polarity for the second coils. If reversal of polarity is not desired, then the winding direction for the second coils is made opposite to that for the first coils. The spacing between the capacitors $C_1$, $C_2$, $C_3$ and $C_4$ facilitates maintenance of the winding pitch thereby enabling use of a flangeless bobbin.

After winding, the leads may be soldered by, for example, dip soldering and the soldered leads inserted into and soldered to through holes in a printed wiring board.

The winding for both embodiments may be effected by any suitable winding method and machine. Examples of suitable machines are multispindle winding machines, such as the WM2001/4-200, WM2001/6-100 and WM2002/6-100 available from Marsilli & Co. spa, Castelleone, Italy.

Advantageously, because the coils $L_1$–$L_6$ and capacitors $C_1$–$C_4$ are electrically interconnected, the assembly may be tested prior to its being mounted to a printed wiring board.

Figure 1:
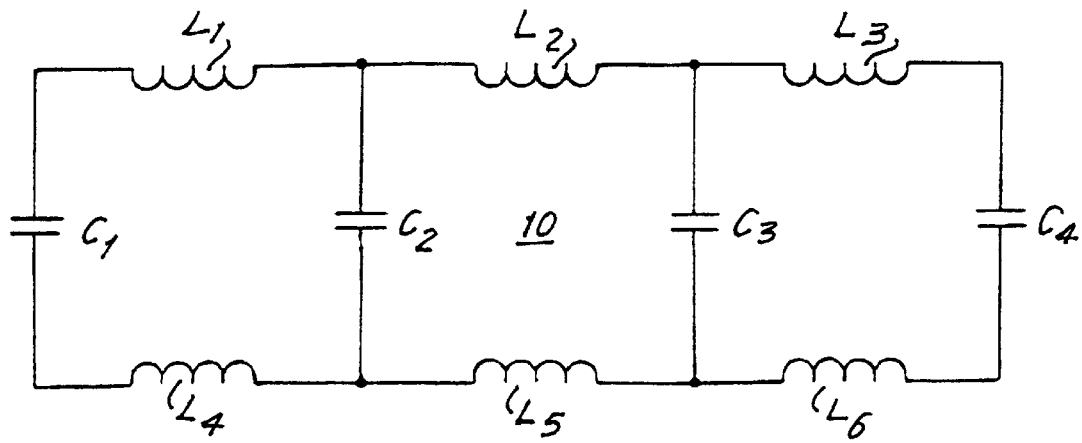
FIG. 1 is an electrical schematic of a conventional butterworth filter.
Figure 2:
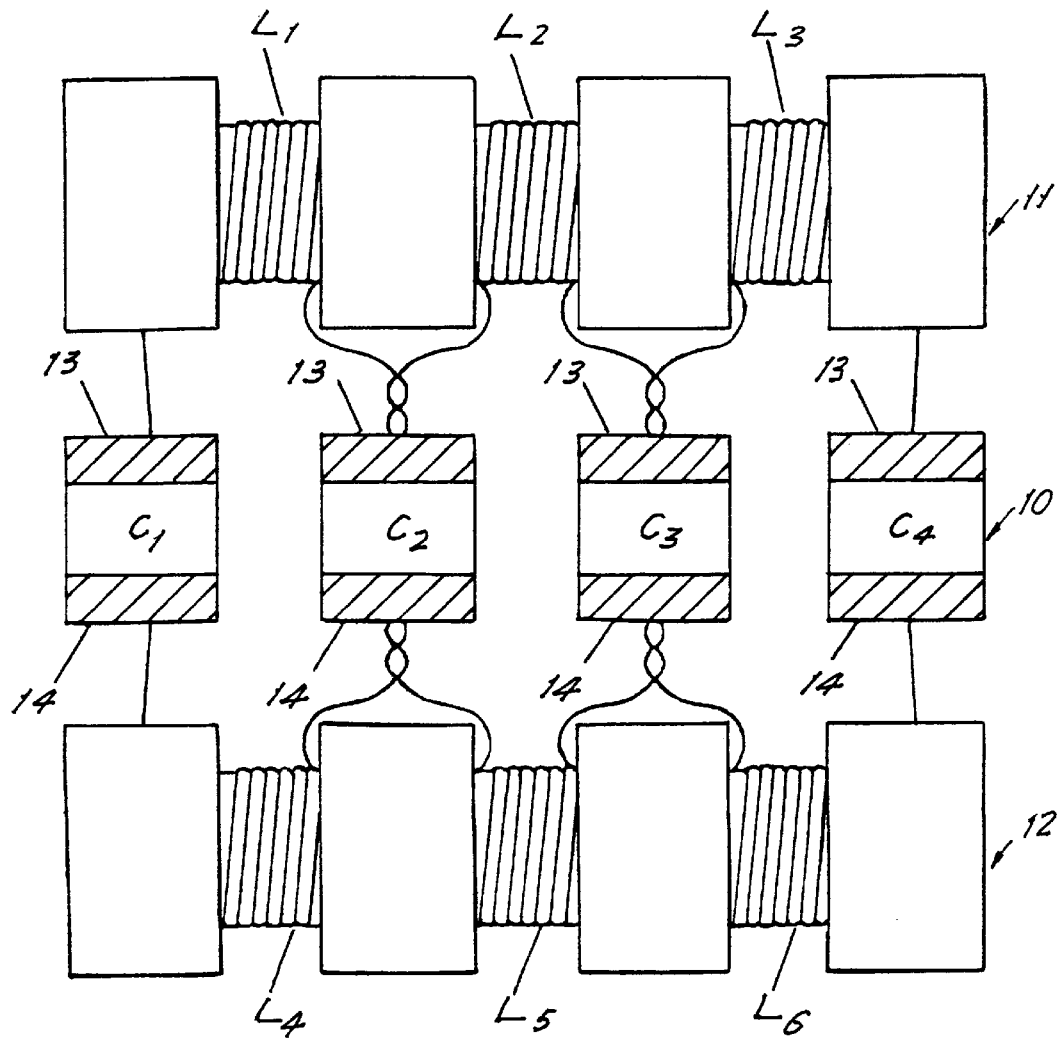
FIG. 2 is a plan view of a prior art assembly of the filter of FIG. 1.

From an electrical schematic standpoint, the filter 40 and the prior art filter 10 of FIG. 1 would appear to be electrically identical. That is, schematically the filter 40 would be represented by the same schematic shown in FIG. 1 for the filter 10. From an electrical performance standpoint, however, the filter 40 exhibits significantly improved performance over the filter 10. More specifically, due to the extremely short interconnect between the inductor ends and the capacitors, there is substantial improvement in insertion loss and a reduction in unwanted leakage as compared to the prior art filter 10. Also, by sharing a common core, coupling and matching of the coils is improved, thereby improving differential to common and common to common rejection.

Although the present invention has been described in relation to particular embodiments thereof, many other variations and modifications and other uses will become apparent to those skilled in the art. For example, although the invention has been described in connection with a Butterworth filter, as should be apparent, its use is not so limited and the invention may be used in connection with other filters and other inductor assemblies, such as delay lines. Also, although the invention has been described in connection with assemblies of inductors and capacitors, it may be used in connection with assemblies of inductors and any other electrical components, such as resistors, or to make any assembly of electrical components. It is preferred, therefore, that the present invention not be limited by the specific disclosure herein, but only by the appended claims.

What is claimed is:

1. An electrical component-inductor assembly, which comprises:
   a plurality of spaced electrical components;
   a pair of respective leads extending from each electrical component;

a common encapsulant encapsulating the electrical components such that portions of each of the leads extend from the encapsulant and such that bobbins are formed between adjacent electrical components;

a first group of coils, each of the coils of the first group being wound about a respective bobbin between adjacent ones of the plurality of electrical components;

a second group of coils, each of the coils of the second group being wound about a respective bobbin between adjacent ones of the plurality of electrical components and over the coils of the first group; and wherein the spacing between adjacent electrical components determines the pitch of the coils wound therebetween and the electrical components and the coils of the first and second groups are electrically interconnected.

2. The assembly of claim 1, wherein the electrical components are capacitors.

3. The assembly of claim 1, wherein the encapsulant includes a magnetic material.

4. A filter, comprising:

a plurality of spaced capacitors;

each capacitor having first and second leads;

a common encapsulant encapsulating the capacitors such that portions of each of the leads extend from the encapsulant and such that bobbins are formed between adjacent capacitors;

first and second groups of coils, each coil of the first group being wound about a respective bobbin between respective ones of the capacitors and each of the coils of the second group being wound about a respective bobbins between respective ones of the capacitors and over the opposite respective coils of the first group, the spacing between adjacent capacitors determining the pitch of the coils wound therebetween; and each of the coils of the first group being connected to adjacent first leads of the capacitors and each of the coils of the second group being connected to adjacent second leads of the capacitors.

5. A filter according to claim 4, wherein each coil of the first group of coils has first and second ends which are connected to the first leads of adjacent capacitors and each end of the second group of coils has first and second ends which are connected to the second leads of adjacent capacitors.

6. The assembly of claims 5, wherein the encapsulant includes a magnetic material.

7. A filter comprising:

a first series branch including a first series of first inductors;

a second series branch including a second series of second inductors equal in number to the number of inductors in the first series branch;

a plurality of capacitors connected in parallel between the first and second series branches, each capacitor having first and second leads;

a common encapsulant encapsulating the capacitors such that portions of the respective first and second leads of the capacitors extend from the encapsulant and such that bobbins are formed between adjacent capacitors; and each of the first and second inductors including respective coils, each coil of the first inductors being wound about a respective bobbin between respective ones of the capacitors and each coil of the second inductors being wound about a respective bobbin between respective ones of the capacitors and over the opposite respective coils of first inductors, the spacing between adjacent capacitors determining the pitch of the coils wound therebetween.

8. A filter according to claim 7, wherein the coils of the first and second inductors are wound in the same direction.

9. A filter according to claim 7, wherein the coils of the first and second inductors are wound in opposite directions.

* * * * *